United States Patent
Kaiki

(10) Patent No.: US 8,194,805 B2
(45) Date of Patent: Jun. 5, 2012

(54) DIGITAL DEMODULATING APPARATUS, DIGITAL RECEIVER, CONTROLLING METHOD OF THE APPARATUS, COMPUTER PROGRAM PRODUCT, AND RECORDING MEDIUM RECORDING THEREON THE PRODUCT

(75) Inventor: Nobuyoshi Kaiki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1059 days.

(21) Appl. No.: 12/118,854

(22) Filed: May 12, 2008

(65) Prior Publication Data

US 2009/0086858 A1 Apr. 2, 2009

(30) Foreign Application Priority Data

Sep. 28, 2007 (JP) ................................. 2007-253878

(51) Int. Cl.
*H04L 27/08* (2006.01)
(52) U.S. Cl. ........................................ 375/345; 375/316
(58) Field of Classification Search .................. 375/345, 375/316
See application file for complete search history.

(56) References Cited

U.S. PATENT DOCUMENTS

| | | | |
|---|---|---|---|
| 6,498,926 B1* | 12/2002 | Ciccarelli et al. | 455/240.1 |
| 6,591,092 B1 | 7/2003 | Tsuruoka | |
| 7,420,627 B2 | 9/2008 | Takagi et al. | |
| 2002/0057750 A1 | 5/2002 | Nakao et al. | |
| 2006/0215590 A1* | 9/2006 | Sharma et al. | 370/311 |
| 2008/0074556 A1* | 3/2008 | Sakai et al. | 348/726 |

FOREIGN PATENT DOCUMENTS

| | | |
|---|---|---|
| CN | 1283334 A | 2/2001 |
| JP | 2001-44964 | 2/2001 |
| JP | 2001-526485 A | 12/2001 |
| JP | 2002-152173 | 5/2002 |
| JP | 2002-217766 | 8/2002 |
| JP | 2005-333198 | 12/2005 |
| JP | 2006-33630 | 2/2006 |
| JP | 2006-74721 | 3/2006 |
| JP | 2006-229733 | 8/2006 |
| JP | 2006-527962 | 12/2006 |
| WO | WO-99/30426 A1 | 6/1999 |
| WO | WO 2004/112384 A2 | 12/2004 |
| WO | WO 2006/013786 A1 | 2/2006 |
| WO | WO 2006/102682 A2 | 9/2006 |

\* cited by examiner

*Primary Examiner* — Shuwang Liu
*Assistant Examiner* — Michael Neff
(74) *Attorney, Agent, or Firm* — Birch, Stewart, Kolasch & Birch, LLP

(57) ABSTRACT

A digital demodulating apparatus includes an intensity changing unit that changes the intensity of a received signal; a channel selecting unit that applies channel selection processing to the signal whose intensity has been changed by the intensity changing unit; a demodulating unit that applies demodulation processing to the signal to which the channel selecting unit has applied channel selection processing; a noise evaluating unit that evaluates an influence of noise components on a desired component in the signal to be input to the demodulating unit; and a gain changing unit that changes, on the basis of a result of the evaluation by the noise evaluating unit, the gain of the change in the intensity of the received signal by the intensity changing unit so that the influence of the noise components is decreased in the signal to be input to the demodulating unit.

16 Claims, 9 Drawing Sheets

DIGITAL DEMODULATING APPARATUS, DIGITAL RECEIVER, CONTROLLING METHOD OF THE APPARATUS, COMPUTER PROGRAM PRODUCT, AND RECORDING MEDIUM RECORDING THEREON THE PRODUCT

BACKGROUND OF THE INVENTION

1. Field of the Invention

The present invention relates to a digital demodulating apparatus, a digital receiver, a controlling method of the apparatus, a computer program product, and a recording medium recording thereon the product.

2. Description of Related Art

In a digital demodulating apparatus that applies channel select processing and demodulation processing to a received signal, the signal to be demodulated may contain a noise component to a desired component. A large affect of the noise component encumbers the accurate demodulation. Therefore, the affect of the noise component is preferably small to the desired component.

Japanese Patent Unexamined Publication No. 2001-526485 discloses a receiver that measures a nonlinear component contained in an output signal from a demodulator to perform bias control of each amplifying stage on the basis of the measurement result. The nonlinear component is generated due to the nonlinearity of each circuit element, and it is one cause of a noise component contained in a signal to be input to the demodulator. In the above Publication, the receiver measures the quantity of the nonlinear component contained in a signal from the demodulator, and controls the 3rd order input intercept point (IIP3) of each circuit element in accordance with the measurement result. The linear performance of the receiver is thereby controlled. Thus, the noise component is suppressed that is caused by the nonlinear component contained in the signal from the demodulator.

On the other hand, even when the linear performance of each circuit element is ensured to a certain degree, the demodulation may not accurately be performed. For example, when the receiver receives a large interference, the signal is distorted unless the gain of each amplifying stage is properly controlled. In the above Publication, however, an AGC control circuit controls the gain of each amplifying stage independently of the measurement result of the nonlinear component. Thus, a proper gain control may not be performed in each circuit element such that the distortion of the output signal is suppressed.

SUMMARY OF THE INVENTION

An object of the present invention is to provide a digital demodulating apparatus, a digital receiver, a controlling method of the apparatus, a computer program product, and a recording medium recording thereon the product, wherein a gain can properly be controlled when the intensity of a signal is changed.

According to an aspect of the present invention, a digital demodulating apparatus comprises an intensity changing unit that changes the intensity of a received signal; a channel selecting unit that applies channel selection processing to the signal whose intensity has been changed by the intensity changing unit; a demodulating unit that applies demodulation processing to the signal to which the channel selecting unit has applied channel selection processing; a noise evaluating unit that evaluates an influence of noise components on a desired component in the signal to be input to the demodulating unit; and a gain changing unit that changes, on the basis of a result of the evaluation by the noise evaluating unit, the gain of the change in the intensity of the received signal by the intensity changing unit so that the influence of the noise components is decreased in the signal to be input to the demodulating unit.

According to another aspect of the present invention, there is provided a controlling method of a digital demodulating apparatus that applies channel select processing and demodulation processing to a received signal. The method comprises an intensity changing step of changing the intensity of the received signal before channel select processing is applied; a noise evaluating step of evaluating an influence of noise components on a desired component in the signal to which demodulation processing is applied; and a gain changing step of changing, on the basis of a result of the evaluation in the noise evaluating step, the gain of the change in the intensity of the received signal in the intensity changing step so that the influence of the noise components is decreased in the signal to which demodulation processing is applied.

According to still another aspect of the present invention, there is provided a computer program product for a digital demodulating apparatus comprising a channel selecting unit that applies channel select processing to a received signal, and a demodulating unit that applies demodulation processing to the signal to which the channel selecting unit has applied channel select processing. The product causes the apparatus to function as an intensity changing unit that changes the intensity of the received signal before the channel selecting unit applies channel selecting processing; a noise evaluating unit that evaluates an influence of noise components on a desired component in the signal to be input to the demodulating unit; and a gain changing unit that changes, on the basis of a result of the evaluation by the noise evaluating unit, the gain of the change in the intensity of the received signal by the intensity changing unit so that the influence of the noise components is decreased in the signal to be input to the demodulating unit.

According to the invention, on the basis of the result of the evaluation of the noise components, the gain is properly changed so as to decrease the influence of the noise components. This makes it easy to accurately perform demodulation processing. For example, when a distortion is generated to increase the noise components, the gain of the intensity changing unit is changed. Thereby, a control can be performed so as to decrease distortions in circuit components in the stages subsequent to the intensity changing unit.

In the present invention, "the intensity changing unit" can comprise not a unit that amplifies a signal, but a unit that attenuates a signal. Thus, "the gain of the change in the intensity of the received signal by the intensity changing unit" means not only the gain of amplification but also an attenuation rate.

In the present invention, it is preferable that the gain changing unit comprises an estimating unit that estimates, on the basis of the result of the evaluation by the noise evaluating unit, whether or not changing the gain decreases the influence of the noise components in the signal to be input to the demodulating unit, and the gain changing unit changes the gain when the estimating unit estimates that the change in the gain decreases the influence of the noise components in the signal to be input to the demodulating unit. In this feature of the invention, because it can be estimated whether or not changing the gain decreases the influence of the noise components, the gain can properly be changed.

In the present invention, it is preferable that the gain changing unit changes the gain and keeps the changed gain value over a predetermined trial period, and the estimating unit estimates, on the basis of results of the evaluation by the noise evaluating unit in the predetermined trial period and in a period other than the predetermined trial period, whether or not changing the gain decreases the influence of the noise components in the signal to be input to the demodulating unit. In this feature of the invention, in accordance with the result of the evaluation of the noise components when the gain is actually changed in the trial period, it is estimated whether or not changing the gain decreases the influence of the noise components in the signal to be input to the demodulating unit. This makes it surer to estimate whether or not changing the gain decreases the influence of the noise components in the signal to be input to the demodulating unit.

In the present invention, the estimating unit preferably estimates, on the basis of a result of the evaluation by the noise evaluating unit in a period that starts after a certain time not longer than the predetermined trial period elapses from the start of the predetermined trial period, whether or not changing the gain decreases the influence of the noise components in the signal to be input to the demodulating unit. In the trial period, the noise components may momentarily widely vary relatively to the desired component immediately after the gain is changed. In the above feature of the invention, however, on the basis of the result of the evaluation of the noise components after a brief interval from the start of the trial period, it is estimated whether or not changing the gain decreases the influence of the noise components. Thus, the result of the change in the gain can be more properly reflected to the estimation result.

In the present invention, it is preferable that the apparatus further comprises an amplifying unit that amplifies the signal from the intensity changing unit, and outputs the amplified signal to the demodulating unit, and a gain controlling unit that controls, on the basis of the intensity of the signal to be input from the channel selecting unit to the demodulating unit, the gain of the amplification of the amplifying unit so that the intensity of the signal has a predetermined value, and the gain controlling unit keeps the gain of the amplification in the predetermined trial period at the gain of the amplification in the period other than the predetermined trial period. In this feature of the invention, when the amplifying unit for the signal is provided between the intensity changing unit and the demodulating unit, the gain of the amplification of the amplifying unit is kept constant in and out of the trial period. This makes it easier to estimate the result of the change in the gain in the trial period.

In the present invention, it is preferable that the demodulating unit comprises a wave equalizing unit that applies wave equalization processing to the signal from the channel selecting unit, and a MER value calculating unit that calculates a modulation error ratio (MER) value of the signal to which the wave equalizing unit has applied wave equalization processing, and the noise evaluating unit evaluates the influence of the noise components on the basis of the MER value calculated by the MER value calculating unit. In this feature of the invention, with the use of the calculated MER value, the influence of the noise components can properly be evaluated.

In the present invention, it is preferable that the demodulating unit comprises a wave equalizing unit that applies wave equalization processing to the signal from the channel selecting unit, and a MER value calculating unit that calculates a modulation error ratio (MER) value of the signal to which the wave equalizing unit has applied wave equalization processing, and the noise evaluating unit evaluates the influence of the noise components on the basis of MER values obtained by a plurality of calculations by the MER value calculating unit in the predetermined trial period. When the influence of the noise components is evaluated on the basis of the result of only one calculation of MER value, for example, the following problem may arise. That is, even though the noise components are averagely low, the gain may be changed on the basis of a temporal increase in the noise components. In the above feature of the invention, however, the influence of the noise components is evaluated on the basis of the result of a plurality of calculations of MER value. Thus, the influence of the noise components can properly be evaluated, and therefore the gain can properly be controlled.

In the present invention, it is preferable that the demodulating unit comprises an error correcting unit that applies error correction processing to the signal from the channel selecting unit, and an error quantity calculating unit that calculates the quantity of errors corrected by the error correcting unit, and the noise evaluating unit evaluates the influence of the noise components on the basis of the quantity of errors calculated by the error quantity calculating unit. In this feature of the invention, by calculating the quantity of corrected errors, the influence of the noise components can properly be evaluated.

In the present invention, it is preferable that the received signal is in the form of a signal train in which a plurality of unit signals each having a predetermined length are successive, and the gain changing unit changes the gain at a timing synchronized with the leading edge of a unit signal. In this feature of the invention, because the gain is changed at a timing synchronized with the leading edge of each unit signal, the number of unit signals to be affected by the change in the gain can be held down to the minimum.

In the present invention, it is preferable that the intensity changing unit comprises a demodulator and a switching unit that selectively takes one of a state in which the received signal is input to the amplifying unit and a state in which the received signal is not input to the amplifying unit, and the gain changing unit switches the state of the switching unit to control the gain. In this feature of the invention, the intensity changing unit capable of changing the gain can simply be realized.

In the present invention, the intensity changing unit is preferably provided in the earliest one of intensity changing stages for changing the signal intensity in the signal path to the demodulating unit. In this feature of the invention, because the intensity changing unit is provided in the earliest stage, distortion and so on of the signal can most effectively be suppressed by controlling the gain of the intensity changing unit.

The present invention can be adopted in various digital receivers such as cellular phones and digital television receivers, including a reproducing unit that reproduce at least one of character data, image data, computer program data, and sound data. Such a digital receiver obtains information on the character data, image data, computer program data, sound data, or the like, from a received signal to which a digital demodulating apparatus of the present invention has applied demodulation processing. The digital receiver then reproduces characters, or the like.

Computer program products of the present invention can be distributed in a form of being recorded on computer-readable recording media including removable type recording media such as compact disc read only memory (CD-ROM) disks, flexible disks (FDs), and magneto optical (MO) disks, and fixed type recording media such as hard disks. The computer program products can be also distributed by wired or wireless electric communication means via a communication network such as the Internet. Such a computer program product may not be exclusive to the digital demodulating apparatus. By using in combination with computer programs for channel select processing and digital demodulation processing, the computer program product may cause a general-purpose information processing apparatus including a general-purpose processor and so on to function as the digital demodulating apparatus.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Figure 1A:
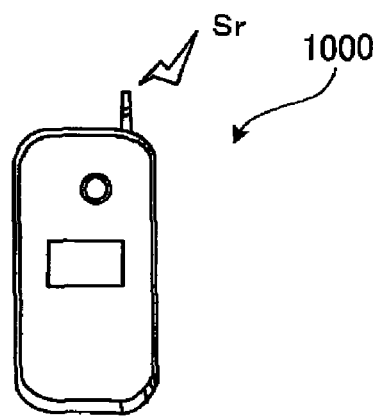
FIG. 1A is a front view of a cellular phone according to an embodiment of the present invention.
Figure 1B:
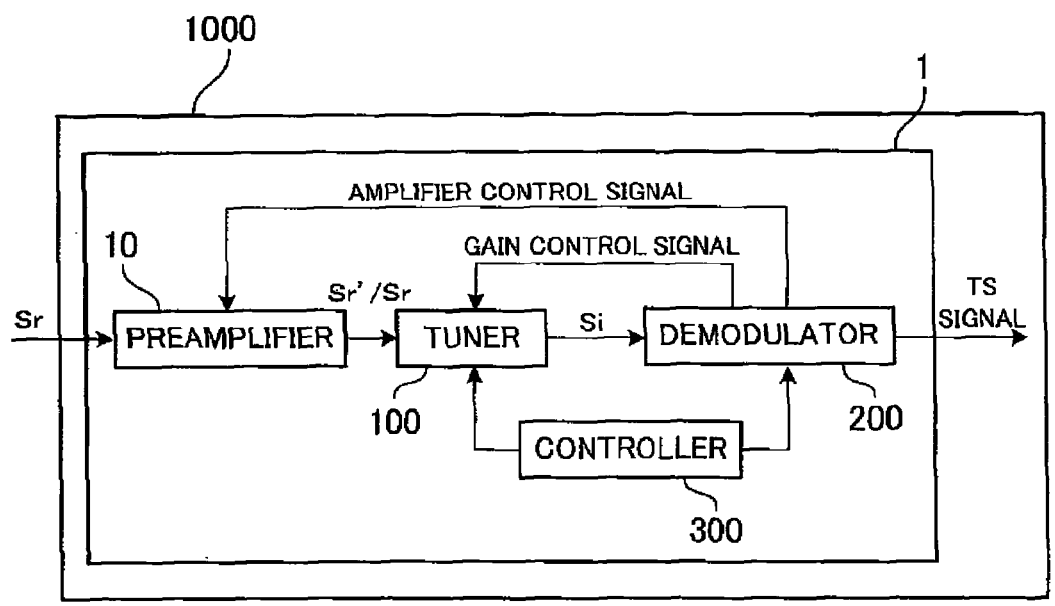
FIG. 1B is a block diagram showing a constitution of a digital demodulating apparatus included in the cellular phone.

Hereinafter will be described a cellular phone according to a preferred embodiment of the present invention. FIG. 1A shows the cellular phone 1000 of the embodiment. FIG. 1B shows a whole general constitution of a digital demodulating apparatus 1 included in the cellular phone 1000.

The cellular phone 1000 of this embodiment includes therein a digital demodulating apparatus 1. The digital demodulating apparatus 1 demodulates a signal Sr received by the cellular phone 1000 through its antenna. Information on data of characters, an image, sound, or a computer program, is taken out from a demodulated signal output from the digital demodulating apparatus 1, and the data is reproduced. The characters, image, and so on are provided to a user of the cellular phone 1000 through a not-shown display and a not-shown speaker provided on the phone 1000. In a modification, the digital demodulating apparatus 1 may be adopted in another digital receiver than such a cellular phone, for example, a digital television (TV) receiver, a wireless local area network (LAN) device, or a personal computer (PC) using wireless LAN.

The digital demodulating apparatus 1 includes a preamplifier 10, a tuner 100, a demodulator 200, and a controller 300. The preamplifier 10 amplifies a signal Sr sent from the antenna of the cellular phone 1000. The preamplifier 10 then outputs the amplified signal Sr' to the tuner 100. Alternatively, the preamplifier 10 outputs the signal Sr to the tuner 100 with no change, as will be described later. The tuner 100 applies channel select processing to the signal Sr' or Sr. That is, the tuner 100 selects a single channel out of a number of channels contained in the signal Sr' or Sr, and receives the single channel. The tuner 100 then converts the signal of the selectively received channel into an intermediate frequency (IF) signal Si, which is sent to the demodulator 200. The demodulator 200 receives the signal Si sent from the tuner 100; demodulates the signal Si; and then outputs the demodulated signal. The demodulated signal is, for example, a so-called transport stream (TS) signal. The demodulator 200 sends an amplifier control signal and a gain control signal to the preamplifier 10 and the tuner 100, respectively. Those control signals will be described later.

The digital demodulating apparatus 1 is made up of a number of circuit components. If not otherwise specified in the below description, each circuit component may be constituted by a group of circuit elements each specialized so as to serve an independent function; or may be realized by hardware devices such as a general-purpose processor, and computer programs that cause the hardware devices such as the processor to operate so as to serve the respective functions as will be described later. In the latter case, each circuit component is realized by the combination of the hardware devices and the computer programs.

<Signal Train>

Next will be described a signal train to be received by the cellular phone 1000. The signal train to be received by the cellular phone 1000 is transmitted by a number of carriers. In the below example of this embodiment, the orthogonal frequency division multiplexing (OFDM) method is adopted for transmitting the signal train to be received by the cellular phone 1000.

A signal according to the OFDM method is in the form of a signal train in which a large number of symbols each having a prescribed length are sequentially arranged. Each symbol contains a number of unit signals superimposed on each other. The unit signals are obtained by modulating carriers different in frequency, in accordance with data having a predetermined data length. Each symbol contains a guard interval at a portion other than the effective portion that contains data. The guard interval that has quite the same signal component as a portion of the rear end of the effective portion, is disposed at the front end of the symbol. The guard interval is used for removing from the received signal the influence of a number of multi-path waves generated in the transmission path from a transmission station that transmitted the signal train, to the cellular phone 1000. The length of the effective portion contained in one symbol is called effective symbol length.

The OFDM signal further contains a number of scattered pilot signals. When the unit signals contained in the signal train are arranged in a plane defined by an axis of time and an axis of frequency, the scattered pilot signals contained in the OFDM signal are arranged at regular intervals along either of the axis of time and the axis of frequency. The scattered pilot signals form a numeric sequence that is represented according to a prescribed coding method or the like, and has been inserted in the signal train in a predetermined arrangement order. In other words, the scattered pilot signals are arranged in the signal train so that the numeric sequence represented according to the prescribed coding method is reproduced when the numeric values indicated by the respective scattered pilot signals are taken in the predetermined arrangement order in the signal train.

Further, the signal train supposed in this embodiment has received various kinds of interleaving processes and various kinds of coding processes in order that error correction can be performed to correct errors generated in the signal train. For example, for coding, Reed-Solomon (RS) coding and Viterbi coding are used. For interleaving used are bit interleaving, byte interleaving, time interleaving, and frequency interleaving. Interleaving as described above is to rearrange temporally or in frequency, data corresponding to signals contained in a transmitted signal. By applying demodulation processing and deinterleave processing, which will be described later, in the cellular phone 1000 to the signal train to which various kinds of coding processes and various kinds of interleaving processes have been applied, errors contained in the signal train can be corrected.

The signal train supposed in this embodiment can be applied to, for example, a transmission system according to Japanese digital terrestrial broadcasting. For the Japanese digital terrestrial broadcasting, the integrated services digital broadcasting-terrestrial (ISDB-T) system is adopted. The signal train of this embodiment can be also applied to another transmission system such as a system according to Chinese digital terrestrial broadcasting standard (GB20600-2006), a system according to European digital terrestrial broadcasting standard (DMB-T/H), a power line communication system, or a wireless LAN system.

<Preamplifier>

Figure 2:
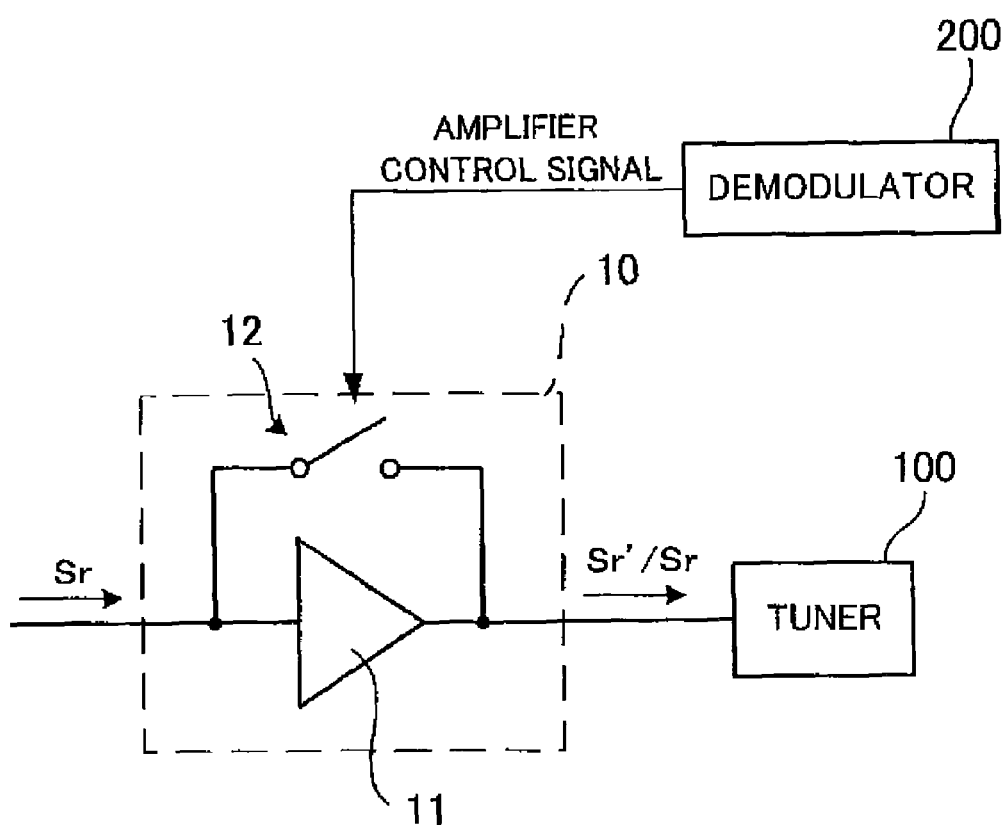
FIG. 2 is a circuit diagram of a preamplifier shown in FIG. 1B.

FIG. 2 shows a constitution including a circuit construction of the preamplifier 10 and its peripheral components. The preamplifier 10 includes an amplifier 11 and a switch 12. The switch 12 is for switching between an amplifier ON state and an amplifier OFF state. In the amplifier ON state, the signal Sr is input to the amplifier 11. In the amplifier OFF state, the signal Sr bypasses the amplifier 11 to be directly input to the tuner 100. The states of the switch 12 are switched in accordance with an amplifier control signal sent from the demodulator 200. In the amplifier ON state, the amplifier 11 amplifies the signal Sr and then outputs the amplified signal Sr' to the tuner 100. In this embodiment, the gain of the amplifier 11 is fixed to a predetermined value.

<Tuner>

Figure 3:
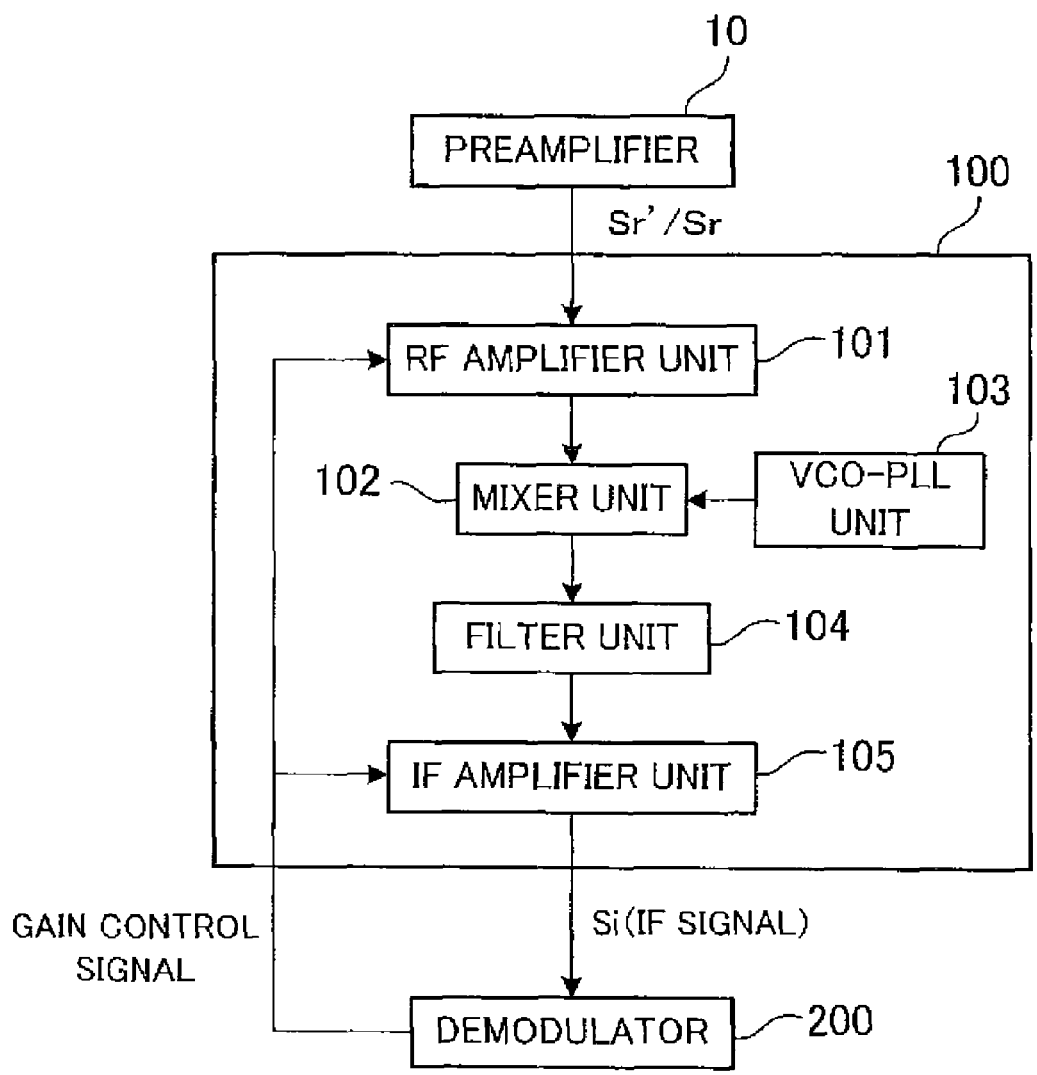
FIG. 3 is a block diagram showing a constitution of a tuner shown in FIG. 1B.

FIG. 3 is a block diagram showing a constitution of the tuner 100. The tuner 100 includes an RF amplifier unit 101, a mixer unit 102, a VCO-PLL unit 103, a filter unit 104, and an IF amplifier unit 105. The signal Sr' or Sr input to the tuner 100 is amplified by the RF amplifier unit 101, and then output to the mixer unit 102. The VCO-PLL unit 103 generates a mixing signal based on a frequency corresponding to a specific channel, which is channel select processing. The mixing signal generated by the VCOPLL unit 103 is output to the mixer unit 102. The mixer unit 102 generates an IF signal Si according to an IF frequency from the signal Sr' or Sr output from the RF amplifier unit 101 and the mixing signal output from the VCO-PLL unit 103.

The IF signal Si generated by the mixer unit 102 is output to the filter unit 104. The filter unit 104 removes unnecessary signal components from the signal Si output from the mixer unit 102. The signal Si from which the unnecessary signal components have been removed, is output to the IF amplifier unit 105. The IF amplifier unit 105 amplifies the signal Si output from the filter unit 104, and then outputs the amplified signal Si to the demodulator 200.

Each of the RF amplifier unit 101 and the IF amplifier unit 105 is constructed into a variable-gain amplifier whose signal gain can be changed. The gain of each the RF amplifier unit 101 and the IF amplifier unit 105 is controlled in accordance with a gain control signal sent from the demodulator 200

<Demodulator>

Figure 4:
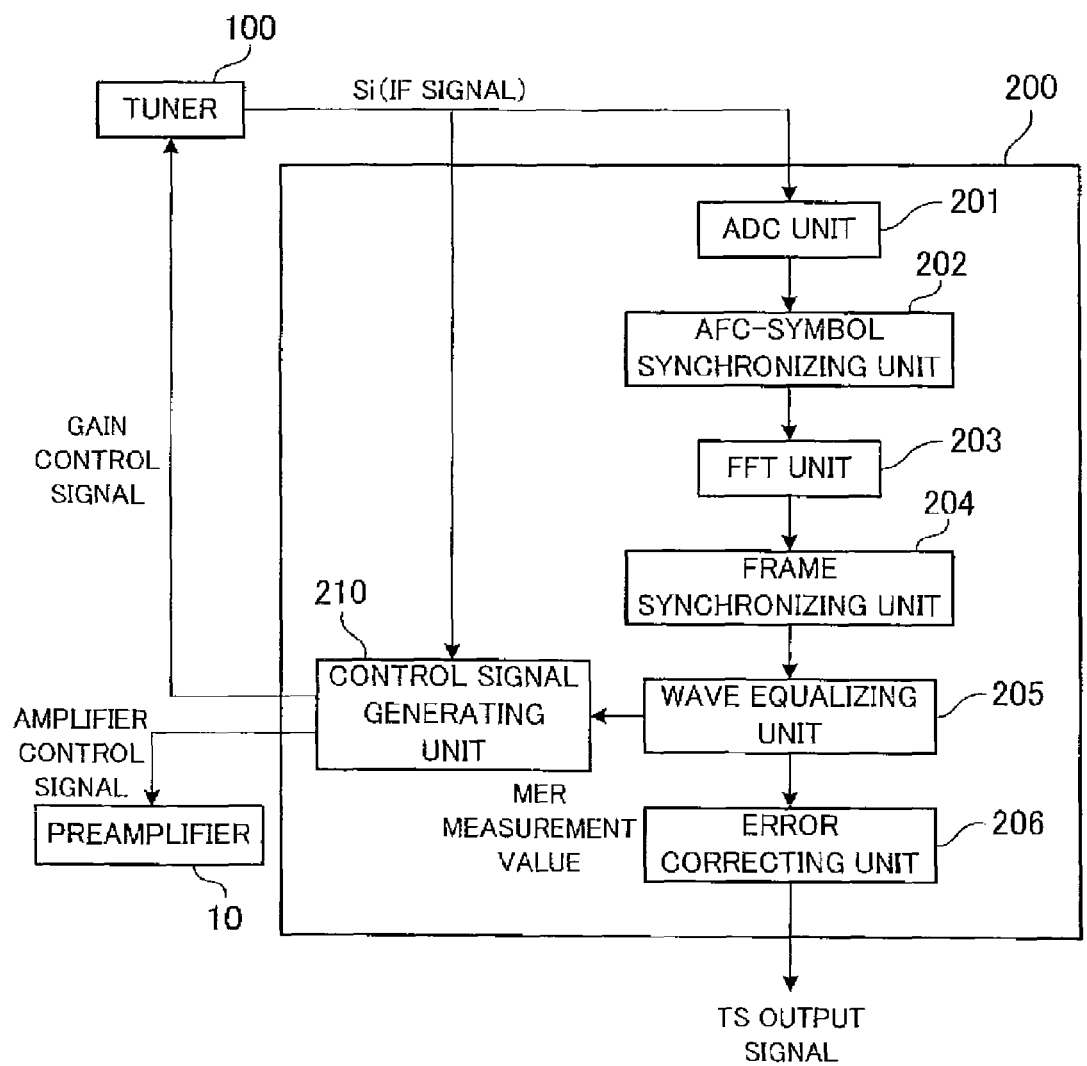
FIG. 4 is a block diagram showing a constitution of a demodulator shown in FIG. 1B.

Next will be described the demodulator 200. FIG. 4 is a block diagram showing a constitution of the demodulator 200. As shown in FIG. 4, the demodulator 200 is constituted by a number of circuit components such as an ADC unit 201, which will be described below.

The demodulator 200 includes an ADC unit 201, an AFC-symbol synchronizing unit 202, a fast Fourier transform (FFT) unit 203, a frame synchronizing unit 204, a wave equalizing unit 205, and an error correcting unit 206. The IF signal Si output from the tuner 100 is input to the ADC unit 201. The ADC unit 201 converts the input analogue signal Si into a digital signal, and outputs the converted digital signal to the AFC-symbol synchronizing unit 202.

The AFC-symbol synchronizing unit 202 applies filter processing and so on to the digital signal output from the ADC unit 201. The AFC-symbol synchronizing unit 202 determines the start point of Fourier transform by the FFT unit 203 as will be described later, that is, a symbol synchronization point, and executes symbol synchronization. The AFC-symbol synchronizing unit 202 then outputs the synchronized digital signal to the FFT unit 203. In a modification, the AFC-symbol synchronizing unit 202 may send information on the symbol synchronization point to the controller 300. In another modification, the AFC-symbol synchronizing unit 202 may derive information on a mode indicating an effective symbol length, and send the information to the controller 300.

In the ISDB-T system, modes indicating effective symbol lengths include a mode 1 of an effective symbol length of 252 microseconds, a mode 2 of an effective symbol length of 504 microseconds, and a mode 3 of an effective symbol length of 1008 microseconds. When the symbol synchronization point is determined, a point that makes it possible to realize the most suitable reception having the least affection of multipath waves, is set to the synchronization point. As a method of determining the synchronization point, a method is used in which correlation of signals is referred to; in which phase shift is corrected with the use of pilot signals such as scattered pilot signals; or the like.

The FFT unit 203 converts by time-frequency Fourier transform the digital signal output from the AFC-symbol synchronizing unit 202. For this Fourier transform, so-called fast Fourier transform (FFT) is used in general. The FFT unit 203 sequentially outputs digital signals to which Fourier transform has been applied, to the frame synchronizing unit 204.

The frame synchronizing unit 204 synchronizes each digital signal output from the FFT unit 203, in a unit of frame. One frame is constituted by, for example, 204 symbols, and a batch of TMCC information is obtained from one frame signal. The digital signal synchronized by the frame synchronizing unit 204 is output to the wave equalizing unit 205.

On the basis of scattered pilot signals contained in the digital signal, the wave equalizing unit 205 applies wave equalization to the digital signal synchronized by the frame synchronizing unit 204.

<Wave Equalizing Unit>

The wave equalization is performed as follows. First, the wave equalizing unit 205 extracts scattered pilot signals from the signal train output from the frame synchronizing unit 204. On the other hand, the wave equalizing unit 205 sequentially generates, as reference signals, signals that indicate the numeric sequence based on the prescribed coding method used for the scattered pilot signals. The wave equalizing unit 205 then divides each extracted scattered pilot signal by the corresponding reference signal generated.

Next, the wave equalizing unit 205 interpolates the above division results along either of an axis of time and an axis of frequency. For the interpolation used is a linear interpolation method, a maximum likelihood estimation method, or the like. The wave equalizing unit 205 then divides by each interpolated numeric value the corresponding unit signal contained in the signal train output from the frame synchronizing unit 204. The wave equalization is thus applied to the signal train. The unit signals to which the wave equalization has been applied are demapped to data items each having a predetermined data length. The demapped result is output to the error correcting unit 206.

In addition, when demapping the signal train, the wave equalizing unit 205 measures for each unit signal the difference of the constellation of the wave-equalized signal train from a constellation reference value, that is, a modulation error ratio (MER) value. The MER value indicates errors in the received signal in relation to constellation. A signal to be input to the wave equalizing unit 205 may contain various noise components other than the desired component that is a component concerning transmission information of the signal. The above errors on constellation are mainly generated due to various noise components generated on the transmission path to the wave equalizing unit 205. In this embodiment, the MER value is calculated so that the higher MER value indicates the smaller intensity of noise components relative to the whole signal intensity. The MER measurement values measured by the wave equalizing unit 205 for respective unit signals are output to the controller in the order of wave equalization processing applied.

The error correcting unit 206 applies error correction to the signal output from the wave equalizing unit 205. The error correction includes deinterleaving processes and a decoding process, which respectively correspond to the interleaving processes and the coding processes applied to the signal on the transmission side. The digital signal to which various kinds of interleaving processes have been applied is restored by the deinterleaving processes to the digital signal before interleaving. In addition, the coded digital signal is restored by the decoding process to the digital signal before coding. Thereby, various kinds of errors are corrected that are contained in the signal by passing through the transmission path. In a modification, the error correcting unit 206 may measure the quantity of error correction when applying the error correction to the digital signal, and calculate a bit error rate (BER). The calculated BER may be output to the controller 300 that will be described later. A digital signal demodulated by the demodulator 200 as described above is output as a TS signal from the demodulator 200.

Figure 5:
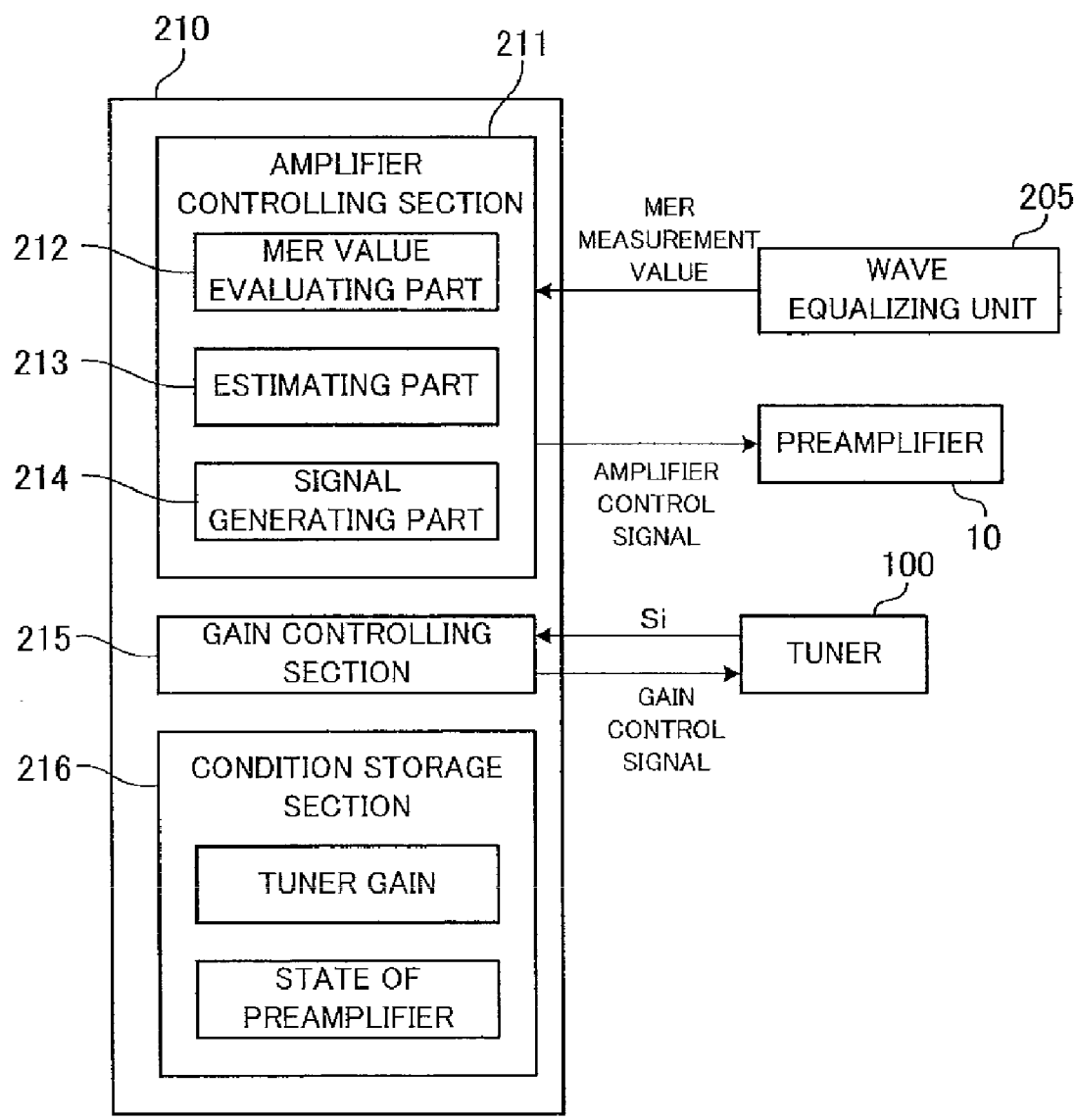
FIG. 5 is a block diagram showing a constitution of a control signal generating unit shown in FIG. 4.

The demodulator 200 further includes a control signal generating unit 210. The control signal generating unit 210 will be described below with reference to FIGS. 4 and 5. FIG. 5 is a block diagram showing a specific constitution of the control signal generating unit 210.

The control signal generating unit 210 includes an amplifier controlling section 211, a gain controlling section 215, and a condition storage section 216. The gain controlling section 215 controls the whole signal gain of the tuner 100. The condition storage section 216 stores therein data that indicates the current value of the gain. The gain controlling section 215 receives as its input the signal Si from the tuner 100. The gain controlling section 215 detects an average intensity of the signal Si, and generates a gain control signal in accordance with the detection result. The gain controlling section 215 then outputs the generated gain control signal to the RF amplifier unit 101 and the IF amplifier unit 105 in the tuner 100. Thereby, the whole gain of the tuner 100 is controlled. For example, the gain controlling section 215 controls the whole gain of the tuner 100 so that the average intensity of the signal Si to be input from the tuner 100 is kept at a fixed value.

The amplifier controlling section 211 generates an amplifier control signal, and then sends the generated signal to the preamplifier 10. The amplifier controlling section 211 receives as its input the MER measurement value from the wave equalizing unit 205. The amplifier controlling section 211 generates the amplifier control signal on the basis of the received MER measurement value and the value of the whole gain of the tuner 100 stored in the condition storage section 216.

As described above, the MER measurement value calculated by the wave equalizing unit 205 indicates the influence of noise components to the desired component in the signal. Such noise components mainly include components generated by the following two causes. The first is a component generated due to an interference contained in the signal to be received by the cellular phone 1000. The received signal contains a desired frequency component as a target from which information is taken out after demodulation. The interference corresponds to any other frequency component than the desired frequency component. For example, the received signal contains a signal on a channel neighboring the desired frequency component, and other signals different in transmission source. These signals can impinge as interferences. The second is a component generated due to thermal noises in circuit components. Hereinafter, the former will be referred to as interference noise, and the latter will be referred to as other noises.

Figure 6:
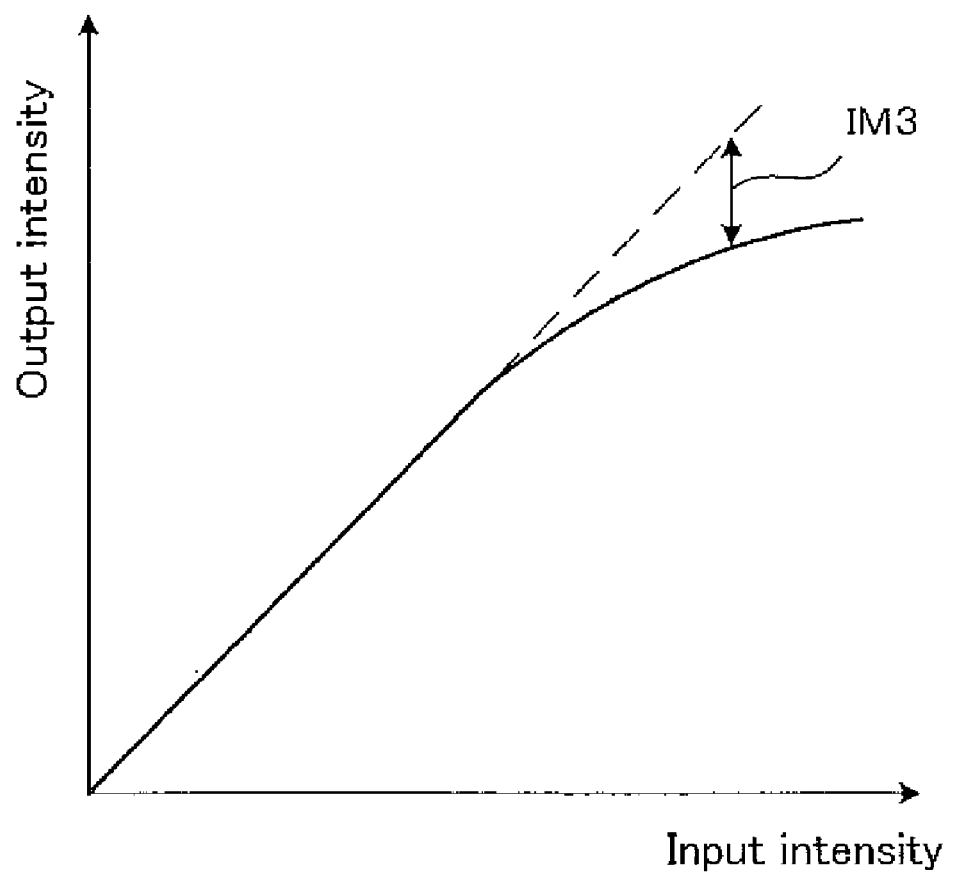
FIG. 6 is a graph showing a case in which a signal is distorted in a circuit component.

The interference noise is a cause of distortion of the signal because an interference wave other than the target wave contained in the received signal affects the frequency of the target wave due to the nonlinearity of each circuit component. For example, the broken line in FIG. 6 shows a case in which the output signal of the RF amplifier unit 101 is amplified ideally linearly to its input signal. However, the signal output from the RF amplifier unit 101 contains a component nonlinear to the input signal. Such a nonlinear component becomes more intensive in accordance with an increase in the intensity of the signal input to the RF amplifier unit 101. The intensity of the nonlinear component changes in accordance with IIP3 of the RF amplifier unit 101. The index IIP3 indicates the degree of the linear performance of the circuit. When a signal input to the RF amplifier unit 101 contains interferences, the interferences cause generation of components of the nonlinear components contained in the signal to be output from the RF amplifier unit 101. Those components may impinge as noise components to the desired component, such as intermodulation distortion and cross-modulation distortion. These noise components are categorized into the interference noise. The solid line in FIG. 6 shows a case in which the output signal from the RF amplifier unit 101 has been distorted due to, for example, intermodulation distortion (IM3). The interference noise becomes more intensive in accordance with an increase in the amplitude of each interference wave contained in the input signal.

On the other hand, the generation of the other noises are caused by heats generated in resistance elements in circuit components and generated due to the base and emitter resistances of transistors in circuit components. In addition, the other noises include so-called shot noise that is generated when electric charges move to pass through an energy barrier in an analogue circuit including a positive-negative (PN) junction. Further the other noises also include so-called flicker noise that is generated when electric charges are trapped at the interface between an oxide and silicon of a metal-oxide-semiconductor field effect transistor (MOSFET). Differently from the above-described interference noise, those noises are generated at substantially fixed intensities irrespective of the intensity of the input signal to the circuit component unless the operation environment of the circuit component varies.

It is changed by switching the state of the preamplifier 10 what intensity of noise component is contained in the signal to be input to the demodulator 200. First, the interference noise generated in a circuit depends on the intensity of the interference component contained in the signal input to the circuit, as described above. Therefore, the intensity of the interference noise to be generated in the circuit changes in accordance with to what degree the amplifier in the preceding stage of the circuit amplifies the signal. On the other hand, the other noises to be generated in a circuit are substantially fixed irrespective of the intensity of the input signal to the circuit. That is, an increase in the intensity of the input signal to the circuit reduces the relative intensity of the other noises to the intensity of the output signal, generated in the circuit.

Thus, the influence of the other noises generated in each circuit component of the tuner 100 can be relatively reduced by putting the preamplifier 10 in the amplifier ON state. This is because the gain can be reduced in each amplifying stage of the tuner 100 by putting the preamplifier 10 in the amplifier ON state to input to the tuner 100 the signal Sr' obtained by amplifying the signal Sr. On the other hand, in the case that the signal Sr contains an interference, if the preamplifier 10 amplifies the signal Sr, the signal Sr' contains the amplified interference is input to the tuner 100. This increases the influence of the interference noise generated in each circuit component of the tuner 100.

In the latter case, therefore, the preamplifier 10 is put in the amplifier OFF state to input the signal Sr to the tuner 100 with no change. Thereby, the influence of the interference noise generated in each circuit component of the tuner 100 can be reduced in comparison with the case of the amplifier ON state of the preamplifier 10. In addition, putting the preamplifier 10 in the amplifier OFF state can prevent generation of interference noise in the amplifier 11 of the preamplifier 10.

As described above, switching the state of the preamplifier 10 changes the influence of the noise components in the signal to be input to the demodulator 200. For this reason, the amplifier controlling section 211 of this embodiment is constituted so as to switch the state of the preamplifier 10 as follows.

The amplifier controlling section 211 includes a MER value evaluating part 212, an estimating part 213, and a signal generating part 214. On the basis of MER measurement values sent from the wave equalizing unit 205, the MER value evaluating part 212 evaluates the influence of the noise components contained in the signal to be input to the demodulator 200. In this case, the MER value evaluating part 212 functions as a noise evaluating unit. More specifically, the MER value evaluating part 212 accumulates therein a number of MER measurement values sent from the wave equalizing unit 205 over a predetermined time period. The MER value evaluating part 212 then calculates a mean value of the accumulated MER measurement values. The larger mean value indicates the smaller influence of the noise components to the desired component in the input signal. Conversely, the smaller mean value indicates the larger influence of the noise components to the desired component.

On the basis of the mean value of the MER measurement values calculated by the MER value evaluating part 212, the estimating part 213 estimates whether or not the influence of the noise components contained in the signal to be input to the demodulator 200 decreases when the state of the preamplifier 10 is switched. When the estimating part 213 estimates that the influence of the noise components decreases, the estimating part 213 instructs the signal generating part 214 to switch the state of the preamplifier 10. Following the instruction of the estimating part 213, the signal generating part 214 generates an amplifier control signal, and then outputs the generated signal to the preamplifier 10. Thereby, the state of the preamplifier 10 is switched. In this case, the estimating part 213 and the signal generating part 214 function as a gain changing unit. The condition storage section 216 stores therein data that indicates the current state of the preamplifier 10. Each time when switching the state of the preamplifier 10, the signal generating part 214 updates the data indicating the state of the preamplifier 10.

How the influence of the noise components is changed by switching the state of the preamplifier 10 depends on how the interference noise and the other noises are generated in each circuit component. However, the quantity of the interference noise contained in the received signal and the quantity of the thermal noises generated in each circuit component vary in accordance with the signal reception environment, the surrounding environment of the circuit component, and so on. Thus, it may not be easy to estimate from the signal reception environment and so on whether or not the influence of the noise components decreases by switching the state of the preamplifier 10.

Figure 7:
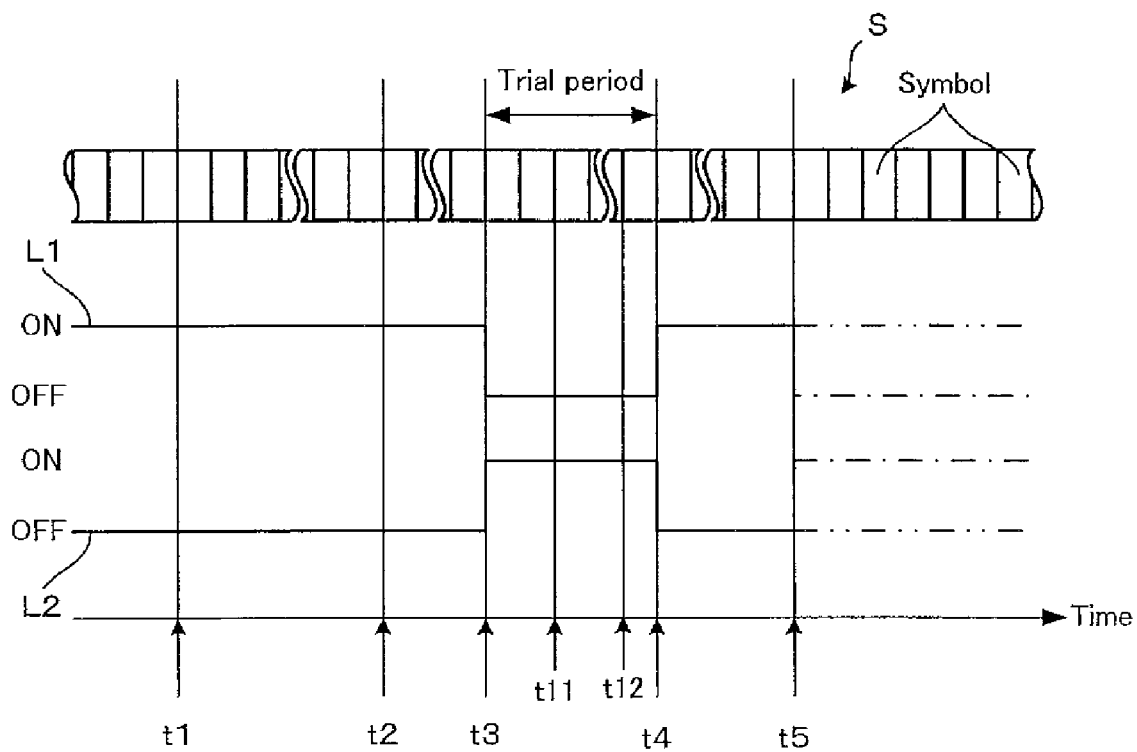
FIG. 7 is a timing chart showing timings for switching the state of the preamplifier.

For the above reason, the estimating part 213 of this embodiment switches as a trial the state of the preamplifier 10 as follows. Thereby, on the basis of MER measurement values when the state of the preamplifier 10 has been switched, the estimating part 213 estimates how the influence of the noise components is changed. FTC. 7 is a timing chart showing the states of the preamplifier 10, periods for measuring MER values, and so on. In FIG. 7, the received signal S is shown as a signal train in which a number of symbols are temporally arranged. A line L1 denotes a case in which the preamplifier 10 is in the amplifier ON state before the trial. A line L2 denotes a case in which the preamplifier 10 is in the amplifier OFF state before the trial.

First, the estimating part 213 holds a mean value of MER measurement values calculated by the MER value evaluating part 212 over a period t1 to t2 in FIG. 7. Next, the estimating part 213 sets as a trial period a period t3 to t4 shorter than the period t1 to t2 in FIG. 7. Any of the times t1 to t4 is set to be synchronized with the leading or rear edge of a symbol. The estimating part 213 then instructs the signal generating part 214 to switch the state of the preamplifier 10 over the period t3 to t4. In addition, the estimating part 213 sends an instruction to the gain controlling section 215 so that the gain of each circuit component of the tuner 100 is kept at the same value over either of the periods t1 to t2 and t3 to t4. The gain controlling section 215 having received the instruction controls the gain of each circuit component of the tuner 100 to be kept at the same value over either of the periods t1 to t2 and t3 to t4.

On the basis of the instruction from the estimating part 213, the signal generating part 214 generates an amplifier control signal to instruct the preamplifier 10 to switch its state at the time t3. When the preamplifier 10 is in the amplifier ON state, the signal generating part 214 generates an amplifier control signal to switch the preamplifier 10 into the amplifier OFF state. On the other hand, when the preamplifier 10 is in the amplifier OFF state, the signal generating part 214 generates an amplifier control signal to switch the preamplifier 10 into the amplifier ON state. The signal generating part 214 then sends the generated amplifier control signal to the preamplifier 10. The signal generating part 214 keeps the preamplifier 10 in the switched state over the period t3 to t4. When the trial period ends at the time t4, the signal generating part 214 restores the preamplifier 10 to its original state. On the other hand, the estimating part 213 holds a mean value of MER measurement values calculated by the MER value evaluating part 212 over a period t11 to t12 within the trial period t3 to t4. The time till is set to a timing after the timing t3 at which the state of the preamplifier 10 is switched.

Next, the estimating part 213 compares the mean value of the MER measurement values of the period t11 to t12 with the mean value of the MER measurement values of the period t1 to t2. When the mean value of the period t11 to t12 is not less than the mean value of the period t1 to t2, the estimating part 213 estimates that switching the state of the preamplifier 10 decreases the influence of the noise components in the signal to be input to the demodulator 200. On the other hand, when the mean value of the period t11 to t12 is less than the mean value of the period t1 to t2, the estimating part 213 estimates that switching the state of the preamplifier 10 increases the influence of the noise components in the signal to be input to the demodulator 200.

As described above, the gain of each circuit component of the tuner 100 is kept at the same value during either of the periods t1 to t2 and t3 to t4. Thus, by simple comparison between the mean values of the MER measurement values measured over the respective periods, it can be judged whether or not the influence of the noise components decreases.

As described above, the estimating part 213 switches as a trial the state of the preamplifier 10, and compares the MER measurement values before and after the trial. This makes it sure and easy to estimate whether or not switching the state of the preamplifier 10 decreases the influence of the noise components.

When the estimating part 213 estimates that switching the state of the preamplifier 10 decreases the influence of the noise components in the signal to be input to the demodulator 200, the estimating part 213 instructs the signal generating part 214 to switch the state of the preamplifier 10 at a time t5 after the time t4. In FIG. 7, alternate long and short dash lines represent cases in which the state of the preamplifier 10 is switched; and alternate long and two short dashes lines represent cases in which the state of the preamplifier 10 is not switched. The time t5 is also set to be synchronized with the leading or rear edge of a symbol.

<Preamplifier Control Flow>

Next, a series of steps in which the amplifier controlling section 211 performs control for switching the state of the preamplifier 10 will be more specifically described with reference to FIG. 8. In Step S1, the amplifier controlling section 211 refers to storage contents of the condition storage section 216 to obtain the current whole gain of the tuner 100. The amplifier controlling section 211 then compares the obtained whole gain of the tuner 100 with a predetermined threshold to judge whether or not the whole gain of the tuner 100 is high. When the amplifier controlling section 211 decides that the current whole gain of the tuner 100 is low, that is, NO in Step S1, the flow advances to Step S10, in which the amplifier controlling section 211 refers to storage contents of the condition storage section 216 to judge whether or not the preamplifier 10 is in the amplifier ON state. When the amplifier controlling section 211 decides that the preamplifier 10 is in the amplifier ON state, that is, YES in Step S10, the flow advances to Step S1, in which the amplifier controlling section 211 switches the preamplifier 10 into the amplifier OFF state. When the amplifier controlling section 211 decides that the preamplifier 10 is in the amplifier OFF state, that is, NO in Step S10, the flow jumps to Step S9.

Thus, when the gain of the tuner 100 is low, the amplifier controlling section 211 performs control of putting the preamplifier 10 in the amplifier OFF state. Such a low gain of the tuner 100 is considered to indicate a state in which the signal received by the cellar phone 1000 has a high amplitude to a certain degree and thus the signal need not to be amplified by the preamplifier 10. In this case, therefore, by properly putting the preamplifier 10 in the amplifier OFF state, the signal is prevented from being distorted in the preamplifier 10. In addition, unnecessary power consumption is suppressed in the preamplifier 10.

On the other hand, the amplifier controlling section 211 decides in Step S1 that the whole gain of the tuner 100 is high, that is, YES in Step S1, the flow advances to Step S2, in which the amplifier controlling section 211 calculates a mean value of MER measurement values measured over a predetermined period. For example, the predetermined period corresponds to the period t1 to t2 in FIG. 7. The predetermined period is set to be longer than the trial period.

In Step S3, the amplifier controlling section 211 refers to storage contents of the condition storage section 216 to judge whether or not the preamplifier 10 is in the amplifier ON state. When the amplifier controlling section 211 decides that the preamplifier 10 is in the amplifier ON state, that is, YES in Step S3, the flow advances to Step S4, in which the amplifier controlling section 211 sets a predetermined trial period; switches the preamplifier 10 into the amplifier OFF state; and keeps the preamplifier 10 in the state over the trial period. For example, the trial period corresponds to the period t3 to t4 in FIG. 7. In Step S5, the amplifier controlling section 211 calculates a mean value of MER measurement values measured over a predetermined period within the trial period. For example, the predetermined period within the trial period corresponds to the period t11 to t12 in FIG. 7.

In Step S6, the amplifier controlling section 211 compares the mean value calculated in Step S5 with the mean value calculated in Step S2. When the amplifier controlling section 211 decides that the mean value calculated in Step S5 is not less than the mean value calculated in Step S2, that is, YES in Step S6, the flow advances to Step S7, in which the amplifier controlling section 211 judges whether or not the calculation of the mean value in Step S5 was performed predetermined times. When the amplifier controlling section 211 decides that the calculation was not performed the predetermined times, that is, NO in Step S7, the flow returns to Step S4. When the amplifier controlling section 211 decides that the calculation was performed the predetermined times, that is, YES in Step S7, the flow advances to Step S8. In Step S8, the amplifier controlling section 211 estimates that switching the preamplifier 10 decreases the influence of the noise components Thus, the amplifier controlling section 211 switches the preamplifier 10 into the amplifier OFF state. When the amplifier controlling section 211 decides in Step S6 that the mean value calculated in Step S5 is less than the mean value calculated in Step S2, that is, NO in Step S6, the amplifier controlling section 211 estimates that switching the preamplifier 10 increases the influence of the noise components. Thus, the flow jumps to Step S9 without switching the state of the preamplifier 10.

In a modification, it is thinkable that the calculation of the mean value in the trial period is performed only once in Step S5. In this modification, when the mean value is not less than the mean value of Step S2, the amplifier controlling section 211 estimates that switching the preamplifier 10 decreases the influence of the noise components. In this modification, however, when the influence of the noise components is temporarily decreased by another cause, the amplifier controlling section 211 may erroneously estimate that switching the preamplifier 10 decreases the influence of the noise components. Contrastingly in this embodiment, as described above, the amplifier controlling section 211 repeats the calculation of a mean value of MER measurement values the predetermined times in Step S5. Only when the amplifier controlling section 211 judges any mean value to be not less than the mean value calculated in Step S2, the amplifier controlling section 211 estimates that switching the preamplifier 10 decreases the influence of the noise components. This makes it more accurate to estimate whether or not switching the preamplifier 10 decreases the influence of the noise components.

When the amplifier controlling section 211 decides in Step S3 that the preamplifier 10 is in the amplifier OFF state, that is, NO in Step S3, the flow advances to Step S12, in which the amplifier controlling section 211 compares the mean value calculated in Step S2 with a predetermined threshold. For example, the threshold has been set to a value that makes it sufficiently possible to take out information from the signal demodulated by the demodulator 200. When the amplifier controlling section 211 decides that the mean value calculated in Step S2 is not less than the predetermined threshold, that is, NO in Step S12, the flow jumps to Step S9 without switching the state of the preamplifier 10. When the mean value calculated in Step S2 is not less than the predetermined threshold, the signal reception condition is considered to he good in the degree that an accurate demodulation is sufficiently possible even in the present state. In this case, therefore, there is no need to switch the preamplifier 10 into the amplifier ON state, which brings about an increase in the power consumption.

When the amplifier controlling section 211 decides in Step S12 that the mean value calculated in Step S2 is less than the predetermined threshold, that is, YES in Step S12, the flow advances to Step S13, in which the amplifier controlling section 211 sets a predetermined trial period; switches the preamplifier 10 into the amplifier ON state; and keeps the preamplifier 10 in the state over the trial period. For example, the trial period corresponds to the period t3 to t4 in FIG. 7. In Step S14, the amplifier controlling section 211 calculates a mean value of MER measurement values measured over a predetermined period within the trial period. For example, the predetermined period within the trial period corresponds to the period t11 to t12 in FIG. 7.

In Step S15, the amplifier controlling section 211 compares the mean value calculated in Step S14 with the mean value calculated in Step S2. When the amplifier controlling section 211 decides that the mean value calculated in Step S14 is not less than the mean value calculated in Step S2, that is, YES in Step S15, the flow advances to Step S16, in which the amplifier controlling section 211 judges whether or not the calculation of the mean value in Step S14 was performed predetermined times. When the amplifier controlling section 211 decides that the calculation was not performed the predetermined times, that is, NO in Step S16, the flow returns to Step S13. When the amplifier controlling section 211 decides that the calculation was performed the predetermined times, that is, YES in Step S16, the flow advances to Step S17. In Step S17, the amplifier controlling section 211 estimates that switching the preamplifier 10 decreases the influence of the noise components. Thus, the amplifier controlling section 211 switches the preamplifier 10 into the amplifier ON state. When the amplifier controlling section 211 decides in Step S15 that the mean value calculated in Step S14 is less than the mean value calculated in Step S2, that is, NO in Step S15, the amplifier controlling section 211 estimates that switching the preamplifier 10 increases the influence of the noise components. Thus, the flow jumps to Step S9 without switching the state of the preamplifier 10.

Also in the procedure of the above branch, like the procedure of Steps S5 to S8, the amplifier controlling section 211 repeats the calculation of a mean value of MER measurement values the predetermined times in Step S14. Only when the amplifier controlling section 211 judges any mean value to be not less than the mean value calculated in Step S2, the amplifier controlling section 211 estimates that switching the preamplifier 10 decreases the influence of the noise components. This makes it more accurate to estimate whether or not switching the preamplifier 10 decreases the influence of the noise components.

In Step S9, the amplifier controlling section 211 judges whether or not the control of the preamplifier 10 should be continued. For example, when the user of the cellular phone 1000 operates the operation panel of the cellular phone 1000 to stop the signal reception, the amplifier controlling section 211 decides that the control of the preamplifier 10 should be ended, that is, NO in Step S9. The flow then ends. On the other hand, for example, when the signal reception is going on, the amplifier controlling section 211 decides that the control of the preamplifier 10 should be continued, that is, YES in Step S9. The flow then advances to Step S18, in which the control of the preamplifier 10 waits for a certain time period. Afterward, the flow returns to Step S1.

<Operations and Effects of the Embodiment>

In the above-described embodiment, on the basis of the mean values of the MER measurement values measured when the preamplifier 10 was switched as a trial, the estimating part 213 estimates whether or not the influence of the noise components is decreased in the signal after switching. The amplifier control section 211 switches the state of the preamplifier 10 in accordance with the estimation result. This makes it easy and accurate to judge whether or not the influence of the noise components is decreased. In addition, on the basis of the accurate estimation result, the state of the preamplifier 10 can be switched so as to decrease the influence of the noise components.

In the above-described embodiment, the switching control is performed for the preamplifier 10 that is in the earliest stage of the circuit components for amplifying the received signal in the digital demodulating apparatus 1. The gain of the earliest amplifying stage influences all of the interference noises to be generated in the succeeding amplifying stages. In addition, increasing the gain of the earliest amplifying stage allows the succeeding amplifying stages to decrease their gains. This relatively suppresses the affection of the other noises such as the thermal noises to be generated in the succeeding circuit components. That is, by switching ON/OFF the earliest amplifying stage as in the above-described embodiment, a control can be performed so as to most effectively suppress the affection of the noise components in the signal to be input to the demodulator 200.

In the above-described embodiment, any timing for switching the state of the preamplifier 10 is set to be synchronized with the leading or rear edge of a symbol. When the state of the preamplifier 10 is switched, a momentary intensive noise may be generated, or the average intensity of the noise components may increase from that before switching. Contrastingly in the above-described embodiment, because any timing for switching is synchronized with the leading or rear edge of a symbol, the affection of noise can be restricted to the minimum symbols.

<Other Modifications>

A preferred embodiment of the present invention has been described above. However, the present invention is never limited to the above-described embodiment. Various changes can be made within the scope of the present invention.

Figure 9:
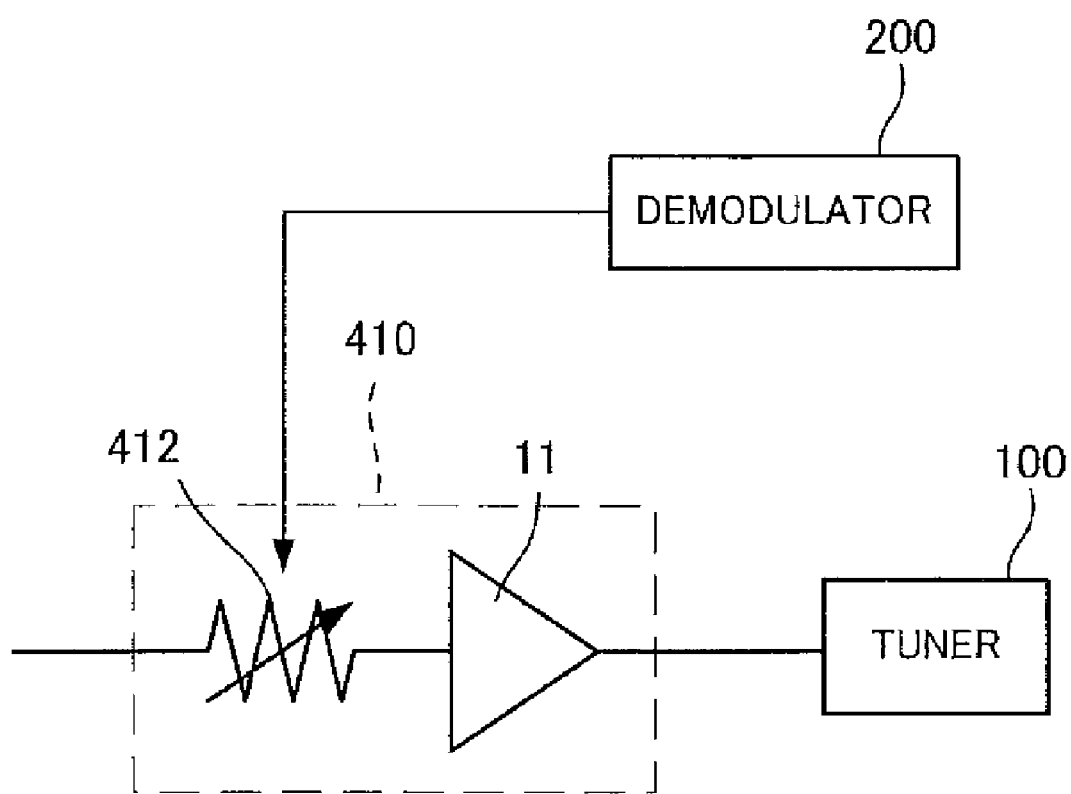
FIG. 9 is a circuit diagram of a preamplifier according to a modification of the embodiment.

For example, in the above-described embodiment, the preamplifier 10 includes the switch 12 to switch between the state in which the amplifier 11 amplifies the received signal and the state in which the amplifier 11 does not amplify the received signal. That is, the amplifier 11 is switched between the ON and OFF states. In a modification, however, a preamplifier may be changed in its gain in a larger number of steps. FIG. 9 shows a circuit construction of a preamplifier 410 as an example of such a variable-gain preamplifier. The preamplifier 410 includes a variable attenuator 412 and an amplifier 11. The gain of the amplifier 11 is fixed. The demodulator 200 can control the attenuation rate of the variable attenuator 412 to control the whole gain of the preamplifier 410. In this modification, when the received signal contains an interference, the attenuation rate of the variable attenuator 412 is increased. This suppresses generation of interference noises in the amplifier 11 and the tuner 100. On the other hand, when the interference is not so intensive, the attenuation rate of the variable attenuator 412 is decreased. This increases the whole gain of the preamplifier 410, and thus relatively suppresses the affection of the other noises such as the thermal noises. In another modification, not an amplifier but only an attenuator may be provided in the stage preceding to the tuner 100.

In the above-described embodiment, the state of the preamplifier 10 is switched as a trial to estimate whether or not the influence of the noise components is decreased. In a modification, however, it may be estimated by another method whether or not the influence of the noise components is decreased. For example, the demodulator 200 includes means that estimates the intensity of the interference. The estimating means estimates on the basis of the variation or the like of MER measurement values the intensity of the interference contained in the received signal of the cellular phone 1000. On the basis of the intensity of the interference estimated by the estimating means, it can be estimated whether or not the influence of the noise components is decreased. When the interference is intensive, putting the preamplifier 10 in the amplifier OFF state will effectively suppress generation of interference noises in the preamplifier 10 and the tuner 100. On the other hand, when the interference is weak and the other noises such as the thermal noises are dominant, putting the preamplifier 10 in the amplifier ON state will relatively suppress the affection of the other noises.

Figure 8:
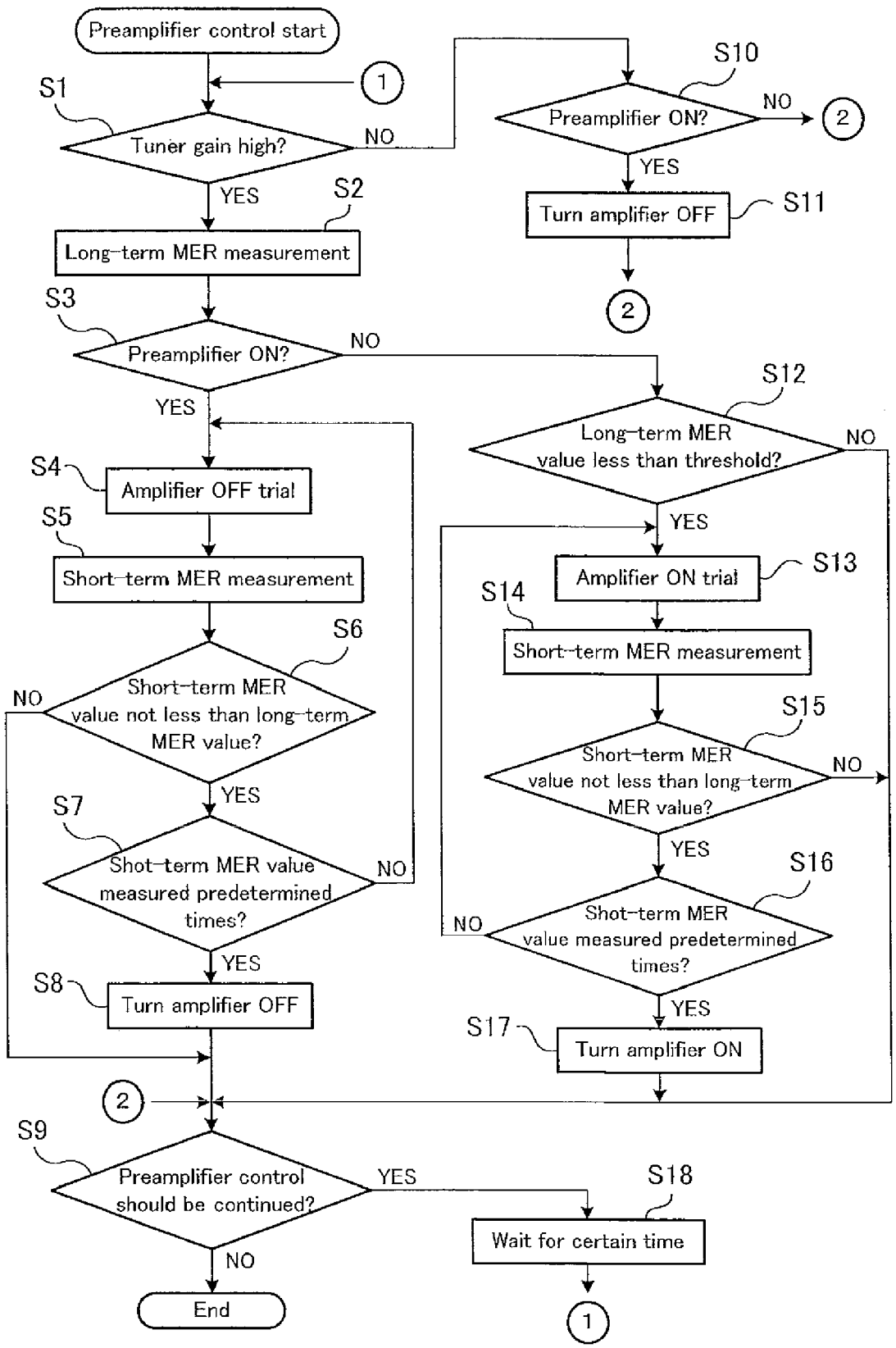
FIG. 8 is a flowchart of processing to be executed by an amplifier controlling unit shown in FIG. 5.

In place of the procedures of Steps S4 to S7 and S13 to S16 in FIG. 8, the following procedure may be executed. First, a short-term MER mean value is calculated predetermined times. Next, it is judged whether or not the number of short-term MER values not less than the long-term MER value exceeds a predetermined value. When the number of short-term MER values not less than the long-term MER value exceeds the predetermined value, it is estimated that the influence of the noise components is decreased.

In the above-described embodiment, the influence of the noise components is evaluated on the basis of the MER values measured in the wave equalizing unit 205. In a modification, however, the influence of the noise components may be evaluated on the basis of BER calculated by the error correcting unit 206. In another modification, the influence of the noise components may be evaluated by another method than the calculation of MER values and the calculation of BER values.

In a modification, in place of the constitution of the tuner 100 shown in FIG. 3, a channel selecting unit that applies channel selection processing to the received signal may includes only the filter unit 104, or only the filter unit 104 and the amplifier unit 105. For example, such a constitution may be used in a power line communication (PLC) system in which the signal Sr or Sr' to be input to the tuner 100 is limited in its frequency band.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A digital demodulating apparatus comprising:
an intensity changing unit that changes an intensity of a received signal;
a channel selecting unit that applies channel selection processing to the signal whose intensity has been changed by the intensity changing unit;
a demodulating unit that applies demodulation processing to the signal to which the channel selecting unit has applied channel selection processing;
a noise evaluating unit that evaluates an influence of noise components on a desired component in the signal to be input to the demodulating unit; and
a gain changing unit that changes, on a basis of a result of the evaluation by the noise evaluating unit, a gain of the change in the intensity of the received signal by the intensity changing unit so that the influence of the noise components is decreased in the signal to be input to the demodulating unit, wherein
the gain changing unit comprises an estimating unit that estimates, on the basis of the result of the evaluation by the noise evaluating unit, whether or not changing the gain decreases the influence of the noise components in the signal to be input to the demodulating unit, and the gain changing unit changes the gain when the estimating unit estimates that the change in the gain decreases the influence of the noise components in the signal to be input to the demodulating unit.

2. The apparatus according to claim 1, wherein the gain changing unit changes the gain and keeps the changed gain value over a predetermined trial period, and
the estimating unit estimates, on the basis of results of the evaluation by the noise evaluating unit in the predetermined trial period and in a period other than the predetermined trial period, whether or not changing the gain decreases the influence of the noise components in the signal to be input to the demodulating unit.

3. The apparatus according to claim 2, wherein the estimating unit estimates, on the basis of a result of the evaluation by the noise evaluating unit in a period that starts after a certain time not longer than the predetermined trial period elapses from the start of the predetermined trial period, whether or not changing the gain decreases the influence of the noise components in the signal to be input to the demodulating unit.

4. The apparatus according to claim 2, wherein the apparatus further comprises an amplifying unit that amplifies the signal from the intensity changing unit, and outputs the amplified signal to the demodulating unit, and
a gain controlling unit that controls, on the basis of the intensity of the signal to be input from the channel selecting unit to the demodulating unit, the gain of the amplification of the amplifying unit so that the intensity of the signal has a predetermined value, and the gain controlling unit keeps the gain of the amplification in the predetermined trial period at the gain of the amplification in the period other than the predetermined trial period.

5. The apparatus according to claim 1, wherein the demodulating unit comprises a wave equalizing unit that applies wave equalization processing to the signal from the channel selecting unit, and a modulation error ratio (MER) value calculating unit that calculates a modulation error ratio value of the signal to which the wave equalizing unit has applied wave equalization processing, and
the noise evaluating unit evaluates the influence of the noise components on the basis of the MER value calculated by the MER value calculating unit.

6. The apparatus according to claim 2, wherein the demodulating unit comprises a wave equalizing unit that applies wave equalization processing to the signal from the channel selecting unit, and a modulation error ratio (MER) value calculating unit that calculates a modulation error ratio value of the signal to which the wave equalizing unit has applied wave equalization processing, and
the noise evaluating unit evaluates the influence of the noise components on the basis of MER values obtained by a plurality of calculations by the MER value calculating unit in the predetermined trial period.

7. The apparatus according to claim 1, wherein the demodulating unit comprises an error correcting unit that applies error correction processing to the signal from the channel selecting unit, and an error quantity calculating unit that calculates the quantity of errors corrected by the error correcting unit, and
the noise evaluating unit evaluates the influence of the noise components on the basis of the quantity of errors calculated by the error quantity calculating unit.

8. The apparatus according to claim 1, wherein the received signal is in the form of a signal train in which a plurality of unit signals each having a predetermined length are successive, and
the gain changing unit changes the gain at a timing synchronized with the leading edge of a unit signal.

9. A digital demodulating apparatus comprising:
an intensity changing unit that changes an intensity of a received signal;
a channel selecting unit that applies channel selection processing to the signal whose intensity has been changed by the intensity changing unit;
a demodulating unit that applies demodulation processing to the signal to which the channel selecting unit has applied channel selection processing;
a noise evaluating unit that evaluates an influence of noise components on a desired component in the signal to be input to the demodulating unit; and
a gain changing unit that changes, on a basis of a result of the evaluation by the noise evaluating unit, a gain of the change in the intensity of the received signal by the intensity changing unit so that the influence of the noise components is decreased in the signal to be input to the demodulating unit, wherein
the intensity changing unit comprises an amplifying unit and a switching unit that selectively takes one of a state in which the received signal is input to the amplifying unit and a state in which the received signal is not input to the amplifying unit, and
the gain changing unit switches the state of the switching unit to control the gain.

10. The apparatus according to claim 1, wherein the intensity changing unit is provided in the earliest one of intensity changing stages for changing the signal intensity in the signal path to the demodulating unit.

11. A digital receiver comprising:
an intensity changing unit that changes an intensity of a received signal;
a channel selecting unit that applies channel selection processing to the signal whose intensity has been changed by the intensity changing unit;
a demodulating unit that applies demodulation processing to the signal to which the channel selecting unit has applied channel selection processing;
a noise evaluating unit that evaluates an influence of noise components on a desired component in the signal to be input to the demodulating unit; and
a gain changing unit that changes, on a basis of a result of the evaluation by the noise evaluating unit, a gain of the change in the intensity of the received signal by the intensity changing unit so that the influence of the noise components is decreased in the signal to be input to the demodulating unit,
the receiver reproducing data including at least one of character data, image data, and sound data, on the basis of the signal from the demodulating unit, wherein
the gain changing unit comprises an estimating unit that estimates, on the basis of the result of the evaluation by the noise evaluating unit, whether or not changing the gain decreases the influence of the noise components in the signal to be input to the demodulating unit, and the gain changing unit changes the gain when the estimating unit estimates that the change in the gain decreases the influence of the noise components in the signal to be input to the demodulating unit.

12. A digital receiver comprising:
an intensity changing unit that changes an intensity of a received signal;
a channel selecting unit that applies channel selection processing to the signal whose intensity has been changed by the intensity changing unit;
a demodulating unit that applies demodulation processing to the signal to which the channel selecting unit has applied channel selection processing;
a noise evaluating unit that evaluates an influence of noise components on a desired component in the signal to be input to the demodulating unit; and
a gain changing unit that changes, on a basis of a result of the evaluation by the noise evaluating unit, a gain of the change in the intensity of the received signal by the intensity changing unit so that the influence of the noise components is decreased in the signal to be input to the demodulating unit,
the receiver reproducing data including at least one of character data, image data, and sound data, on the basis of the signal from the demodulating unit, wherein
the intensity changing unit comprises an amplifying unit and a switching unit that selectively takes one of a state in which the received signal is input to the amplifying unit and a state in which the received signal is not input to the amplifying unit, and
the gain changing unit switches the state of the switching unit to control the gain.

13. A controlling method of a digital demodulating apparatus that applies channel select processing and demodulation processing to a received signal, the method comprising:
an intensity changing step of changing an intensity of the received signal before channel select processing is applied;

a noise evaluating step of evaluating an influence of noise components on a desired component in the signal to which demodulation processing is applied; and a gain changing step of changing, on a basis of a result of the evaluation in the noise evaluating step, a gain of the change in the intensity of the received signal in the intensity changing step so that the influence of the noise components is decreased in the signal to which demodulation processing is applied, the method further comprising:

an estimating step of estimating, on the basis of the result in the noise evaluating step, whether or not changing the gain decreases the influence of the noise components in the signal to be input to a demodulating unit; and a changing step of changing the gain when it is estimated that the change in the gain decreases the influence of the noise components in the signal to be input to the demodulating unit.

14. A controlling method of a digital demodulating apparatus that applies channel select processing and demodulation processing to a received signal, the method comprising:

an intensity changing step of changing an intensity of the received signal before channel select processing is applied;

a noise evaluating step of evaluating an influence of noise components on a desired component in the signal to which demodulation processing is applied; and a gain changing step of changing, on a basis of a result of the evaluation in the noise evaluating step, a gain of the change in the intensity of the received signal in the intensity changing step so that the influence of the noise components is decreased in the signal to which demodulation processing is applied, selectively taking one of a state in which the received signal is input to an amplifying unit and a state in which the received signal is not input to the amplifying unit; and switching the state to control the gain.

15. A non-transitory computer-readable recording medium recording thereon a computer program product for a digital demodulating apparatus comprising a channel selecting unit that applies channel select processing to a received signal, and a demodulating unit that applies demodulation processing to the signal to which the channel selecting unit has applied channel select processing, the product causing the apparatus to function as:

an intensity changing unit that changes an intensity of the received signal before the channel selecting unit applies channel selecting processing;

a noise evaluating unit that evaluates an influence of noise components on a desired component in the signal to be input to the demodulating unit; and a gain changing unit that changes, on a basis of a result of the evaluation by the noise evaluating unit, a gain of the change in the intensity of the received signal by the intensity changing unit so that the influence of the noise components is decreased in the signal to be input to the demodulating unit, wherein the gain changing unit comprises an estimating unit that estimates, on the basis of the result of the evaluation by the noise evaluating unit, whether or not changing the gain decreases the influence of the noise components in the signal to be input to the demodulating unit, and the gain changing unit changes the gain when the estimating unit estimates that the change in the gain decreases the influence of the noise components in the signal to be input to the demodulating unit.

16. A non-transitory computer-readable recording medium recording thereon a computer program product for a digital demodulating apparatus comprising a channel selecting unit that applies channel select processing to a received signal, and a demodulating unit that applies demodulation processing to the signal to which the channel selecting unit has applied channel select processing, the product causing the apparatus to function as:

an intensity changing unit that changes an intensity of the received signal before the channel selecting unit applies channel selecting processing;

a noise evaluating unit that evaluates an influence of noise components on a desired component in the signal to be input to the demodulating unit; and a gain changing unit that changes, on a basis of a result of the evaluation by the noise evaluating unit, a gain of the change in the intensity of the received signal by the intensity changing unit so that the influence of the noise components is decreased in the signal to be input to the demodulating unit, wherein the intensity changing unit comprises an amplifying unit and a switching unit that selectively takes one of a state in which the received signal is input to the amplifying unit and a state in which the received signal is not input to the amplifying unit, and the gain changing unit switches the state of the switching unit to control the gain.

* * * * *